United States Patent
Nihtianov et al.

(10) Patent No.: US 9,331,117 B2
(45) Date of Patent: May 3, 2016

(54) SENSOR AND LITHOGRAPHIC APPARATUS

(71) Applicant: ASML Netherlands B.V., Veldhoven (NL)

(72) Inventors: Stoyan Nihtianov, Eindhoven (NL); Haico Victor Kok, Veldhoven (NL); Martijn Gerard Dominique Wehrens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/439,481

(22) PCT Filed: Oct. 9, 2013

(86) PCT No.: PCT/EP2013/071080
§ 371 (c)(1),
(2) Date: Apr. 29, 2015

(87) PCT Pub. No.: WO2014/067754
PCT Pub. Date: May 8, 2014

(65) Prior Publication Data
US 2015/0294998 A1     Oct. 15, 2015

Related U.S. Application Data (60) Provisional application No. 61/720,700, filed on Oct. 31, 2012.

(51) Int. Cl.
*H01L 21/00*     (2006.01)
*H01L 27/146*     (2006.01)
(Continued)

(52) U.S. Cl.
CPC .......... *H01L 27/1464* (2013.01); *G03F 7/7085* (2013.01); *G03F 7/70558* (2013.01);
(Continued)

(58) Field of Classification Search
CPC ................... H01L 31/0216; H01L 31/022408; H01L 31/105; H01L 31/1185; H01L 27/14601; H01L 27/1464; H01L 27/14683
USPC .......................................... 438/73; 257/447
See application file for complete search history.

(56) References Cited

U.S. PATENT DOCUMENTS

| | | |
|---|---|---|
| 4,142,200 A | 2/1979 | Mizushima et al. |
| 5,376,810 A | 12/1994 | Hoenk et al. |

(Continued)

FOREIGN PATENT DOCUMENTS

EP     2 009 705 A2     12/2008

OTHER PUBLICATIONS

Popadić, M., et al., "Controlled Growth of Non-Uniform Arsenic Profiles in Silicon Reduced-Pressure Chemical Vapor Deposition Epitaxial Layers," Journal of Electronic Materials, vol. 38, No. 11, 2009; pp. 2323-2328.

(Continued)

*Primary Examiner* — Trung Q Dang
(74) *Attorney, Agent, or Firm* — Sterne, Kessler, Goldstein & Fox P.L.L.C.

(57) ABSTRACT

A backside illuminated sensor comprising a supporting substrate, a semiconductor layer which comprises a photodiode comprising a region of n-doped semiconductor provided at a first surface of the semiconductor layer, and a region of p-doped semiconductor, wherein a depletion region is formed between the region of n-doped semiconductor and the region of p-doped semiconductor, and a layer of p-doping protective material provided on a second surface of the semiconductor layer, wherein the first surface of the semiconductor layer is fixed to a surface of the supporting substrate.

7 Claims, 6 Drawing Sheets

(51) Int. Cl.
*G03F 7/20* (2006.01)
*H01L 31/028* (2006.01)
*H01L 31/0352* (2006.01)
*H01L 31/18* (2006.01)

(52) U.S. Cl.
CPC .... *H01L27/14609* (2013.01); *H01L 27/14643* (2013.01); *H01L 27/14689* (2013.01); *H01L 31/028* (2013.01); *H01L 31/035281* (2013.01); *H01L 31/1804* (2013.01)

(56) References Cited

U.S. PATENT DOCUMENTS

| | | |
|---|---|---|
| 2004/0021061 A1 | 2/2004 | Bijkerk |
| 2009/0200585 A1* | 8/2009 | Nozaki ............... H01L 27/1464 257/292 |
| 2011/0101482 A1* | 5/2011 | Meynants ......... H01L 27/14601 257/432 |
| 2011/0169116 A1* | 7/2011 | Nanver ........... H01L 31/022408 257/429 |
| 2012/0252155 A1 | 10/2012 | Choi et al. |
| 2013/0264481 A1* | 10/2013 | Chern ................. H01L 31/0216 250/358.1 |
| 2014/0034816 A1* | 2/2014 | Chuang ................ H01J 29/385 250/216 |

OTHER PUBLICATIONS

Sarubbi, F., et al., "Pure Boron-Doped Photodiodes: a Solution for Radiation Detection in EUV Lithography," Proceedings of 38$^{th}$ European Solid-State Device Research Conference (ESSDERC 2008), Sep. 2008; pp. 278-281.

Shi, L., Performance Analysis of Si-Based Ultra-Shallow Junction Photodiodes for UV Radiation Detection, Master of Science in Electrical Engineering Thesis, Delft University of Technology, Apr. 2013; 142 pages.

International Search Report directed to related International Patent Application No. PCT/EP2013/071080, mailed Jun. 17, 2014; 4 pages.

International Preliminary Report on Patentability and Written Opinion of the International Searching Authority directed to related International Patent Application No. PCT/EP2013/071080, issued May 5, 2015; 10 pages.

\* cited by examiner

SENSOR AND LITHOGRAPHIC APPARATUS

CROSS-REFERENCE TO RELATED APPLICATIONS

This application claims the benefit of U.S. provisional application 61/720,700, which was filed on Oct. 31, 2012, and which is incorporated herein in its entirety by reference.

FIELD

The present invention relates to a sensor and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

Convention lithographic apparatus use radiation having a wavelength of 193 nm. This is an example of deep ultraviolet (DUV) radiation. In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

Various types of radiation sensors may be used as metrology tools. For example they may be used to characterize optical elements in a processing tool such as a lithographic apparatus, providing information regarding the quality of the image. An example of such sensor is a CMOS type, front-side illuminated, interferometer sensor which typically uses a conversion material (i.e. a scintillator) to convert (D)UV or EUV photons to photons with longer wavelengths, and then detect the longer wavelength photons. Such conversion material based sensors may suffer however from poor resolution and/or poor signal to noise ratios, they are slow and may be blurry, or may suffer from other disadvantages.

Other sensors were proposed in the prior art based on direct radiation detection (with no use of a conversion material). One example of direct radiation detection sensor is described in US 2004/0021061 A1, which relates to a charge-coupled (CCD) backside-illuminated sensor having a n-on-p junction photodiode. Alternative protective layers including boron are proposed instead of standard SiO2 passivation layer to avoid oxidation or contamination of the sensor surface. However, even a few nm thick protective layer may be sufficient to provide absorption of radiation, therefore an improved sensor stability may be achieved at the cost of decreased sensitivity.

Another variant of a direct radiation detecting sensor is described in U.S. Pat. No. 5,376,810 wherein a backside-illuminated CCD uses a low temperature (≤450° C.), delta-doping molecular beam epitaxy (MBE) process to grow a sharp dopant profile of a few atomic layers in silicon. Such sensor seems to be however limited to UV spectrum only.

A further direct radiation detecting sensor is described in EP 2009705, wherein a p-on-n junction is created at the front surface of a semiconductor substrate by depositing a p-dopant (boron) material on top of a n-doped semiconductor using a high temperature deposition process such as chemical vapor deposition (CVD). Such front-side illuminated sensor provides high sensitivity for EUV and (D)UV radiation and good surface charge collection efficiency, as also shown in chapter 4 of PhD thesis entitled "Performance Analysis of Si-Based Ultra-Shallow Junction Photodiodes for UV Radiation Detection", by Lei Shi (April 2013). Although such high-temperature boron deposition technology may be suitable for manufacturing imaging sensors with a simple construction, such as transmission imaging sensors, it has been found unsuitable for manufacturing CMOS or CCD based radiation sensors because components of the sensor such as internal circuitry, wiring or poly-silicon gates are damaged.

SUMMARY

It is desirable to provide a radiation sensor which overcomes one or more of the above disadvantages, or some other disadvantage associated with prior art sensors.

According to an aspect of the invention, there is provided a backside illuminated sensor comprising a supporting substrate, a semiconductor layer which comprises a photodiode comprising a region of n-doped semiconductor provided at a first surface of the semiconductor layer, and a region of p-doped semiconductor, wherein a depletion region is formed between the region of n-doped semiconductor and the region of p-doped semiconductor, and a layer of p-doping protective material provided on a second surface of the semiconductor layer, wherein the first surface of the semiconductor layer is fixed to a surface of the supporting substrate.

According to an aspect of the invention, there is provided a backside-illuminated radiation sensor comprising a semiconductor layer which comprises a photodiode comprising a region of n-doped semiconductor provided at a first surface of the semiconductor layer, and a region of p-doped semiconductor, wherein a depletion region is formed between the region of n-doped semiconductor and the region of p-doped semiconductor; a layer of p-doping protective material provided on a second, backside surface of the semiconductor layer; and a diffusion layer formed below the layer of p-doping protective material, providing a transition between the layer of p-doping protective material and the region of p-doped semiconductor; wherein the diffusion layer generates an internal electric field which complements an electric field generated by the photodiode.

The p-doping protective material may be resistant to damage caused by DUV and/or EUV radiation. The p-doping protective material may be resistant to damage caused by cleaning agents. The p-doping protective material may be substantially transparent to DUV and/or EUV radiation, or provided in a layer which is sufficiently thin that a significant proportion of incident DUV and/or EUV radiation passes through the protective layer. The p-doping protective material is a material which may diffuse in a semiconductor substrate. The diffusion may have a gradient diffusion profile such that a transition between boron and silicon is accomplished within a narrow layer thickness. A gradient diffusion layer of the p-doping protective material at the backside-illuminated surface of the p-doped semiconductor region may be created such that the transition between the p-doping protective material and the semiconductor layer generates an internal electric field which complements an electric field generated by the photodiode.

The p-doping protective material is also a material which can be activated to be bonded to the semiconductor network, thereby forming an activated compound layer having substantially less (reactive) dangling bonds than the semiconductor layer itself, and thus minimizing the risk of photo-generated particle recombination. Herein a "dangling bond" is an unsatisfied valence on an immobilized semiconductor atom. A silicide layer is an example of an activated layer having less dangling bonds than the silicon substrate, due to the bonding of the p-doping material atoms in the silicon network. As a result, the activated compound layer provides better hardness against radiation induced damaging.

The depletion region may extend to a location where a transition between the p-doping protective material and the semiconductor layer takes place.

The protective material may be deposited on the semiconductor layer at a temperature lower than 500° C. This is advantageous because it avoids damaging the circuitry.

The protective material may be boron or boride, or mixtures thereof. The boride may for example be gallium boride, boron nitride, boron fluoride $BF_2$, boron carbide $B_4C$ or mixtures thereof.

Intrinsic semiconductor may be provided between the region of n-doped semiconductor and the region of p-doped semiconductor.

Circuitry may be provided between the photodiode and the supporting substrate.

The circuitry may be a CMOS or a CCD circuitry.

A protective layer may be provided between the circuitry and the supporting substrate.

The photodiode may be one of an array of photodiodes which all share the same semiconductor layer.

The region of n-doped semiconductor may be one of an array of regions of n-doped semiconductor.

The p-doped semiconductor may be silicon.

The n-doped semiconductor is silicon. The supporting substrate may be silicon.

The n-doped semiconductor may be formed by diffusing dopant into the semiconductor layer via heating to a temperature in excess of 500° C.

The sensor may be for use in the detection of EUV radiation, DUV radiation, VIS radiation or a beam of low energy particles. The low energy particles may for example be electrons. The low energy particles may have for example an energy between 200 eV and 40 keV.

Alternatively to first aspect of the invention there is provided a backside-illuminated radiation sensor comprising:

a semiconductor layer which comprises a photodiode comprising a region of p-doped semiconductor provided at a first surface of the semiconductor layer, and a region of n-doped semiconductor, wherein a depletion region is formed between the region of n-doped semiconductor and the region of p-doped semiconductor;

a layer of n-doping protective material provided on a second, backside surface of the semiconductor layer; and a diffusion layer formed below the layer of n-doping protective material, providing a transition between the layer of n-doping protective material and the region of n-doped semiconductor;

wherein the diffusion layer generates an internal electric field which complements an electric field generated by the photodiode.

The n-doping protective material may be arsenic or phosphorous.

According to a second aspect of the invention there is provided a backside illuminated sensor comprising a supporting substrate, a semiconductor layer, a CCD array being provided at a first surface of the semiconductor layer and a layer of p-doping protective material being provided on a second surface of the semiconductor layer, wherein the first surface of the semiconductor layer is fixed to a surface of the supporting substrate. This sensor also comprises a diffusion layer formed below the layer of p-doping protective material, providing a transition between the layer of p-doping protective material and the region of p-doped semiconductor; wherein the diffusion layer generates an internal electric field which complements an electric field generated by the photodiode.

According to a third aspect of the invention there is provided a processing tool such as a lithographic process tool comprising a backside illuminated sensor according to any preceding aspect.

The processing tool may be a lithographic apparatus.

The lithographic apparatus may be a lithographic projection apparatus arranged to project a pattern from a patterning device onto a substrate.

The lithographic apparatus may further comprise an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to a fourth aspect of the invention there is provided a substrate table such as a lithographic substrate table provided with a backside illuminated sensor according to any preceding aspect.

According to a fifth aspect of the invention there is provided a camera chip comprising backside illuminated sensor according to any preceding aspect.

According to a sixth aspect of the invention there is provided a method of making a backside-illuminated sensor comprising providing a p-doped semiconductor layer on a first substrate, forming an n-doped portion at a first surface of a p-doped semiconductor layer, such that a photodiode is formed with a depletion region between the region of n-doped semiconductor and the p-doped semiconductor layer, providing circuitry on top of the photodiode, inverting the semiconductor layer and fixing it to a second substrate, removing the first substrate, and providing a layer of p-doping protective material on top of the semiconductor layer.

The n-doped portion may be one of an array of n-doped portions which form an array of photodiodes with the p-doped semiconductor layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims and clauses appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
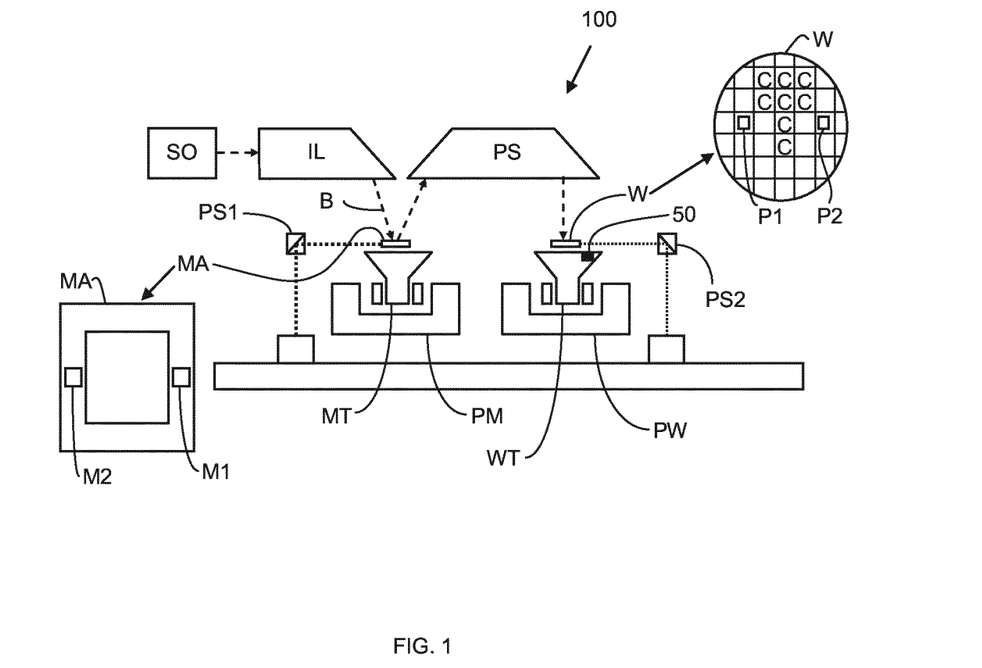
FIG. 1 depicts a lithographic apparatus according to an embodiment of the invention.

FIG. 1 schematically depicts a lithographic apparatus 100 according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask). The apparatus may alternatively be of a transmissive type (e.g., employing a transmissive mask and optics). The apparatus may be a DUV lithographic apparatus.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

EUV radiation may be produced using a plasma. A radiation system for producing EUV radiation may include a laser for exciting a fuel to provide the plasma, and a radiation source for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The radiation source may include an enclosing structure or chamber arranged to provide a vacuum environment to support the plasma. Such a radiation system is typically termed a laser produced plasma (LPP) source. In an alternative radiation system, the plasma is generated by applying an electrical discharge across a gap at which fuel such as tin is located. Such a radiation system is typically termed a discharge produced plasma (DPP) source.

Referring to FIG. 1, the illuminator IL receives an extreme ultra violet radiation beam from the radiation source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The radiation source SO may be part of an EUV radiation system including a laser, not shown in FIG. 1, for providing the laser beam exciting the fuel. The resulting plasma emits output radiation, e.g., EUV radiation, which is collected using a radiation collector, disposed in the radiation source. The laser and the radiation source may be separate entities, for example when a $CO_2$ laser is used to provide the laser beam for fuel excitation.

In such cases, the laser is not considered to form part of the lithographic apparatus and the laser beam is passed from the laser to the radiation source with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the radiation source or may be a separate entity that is connected via an electrical connection to the radiation source.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2. The lithographic apparatus 100 may include a sensor 50 according to an embodiment of the invention. The sensor 50 may for example be located at the substrate table WT.

Figure 2:
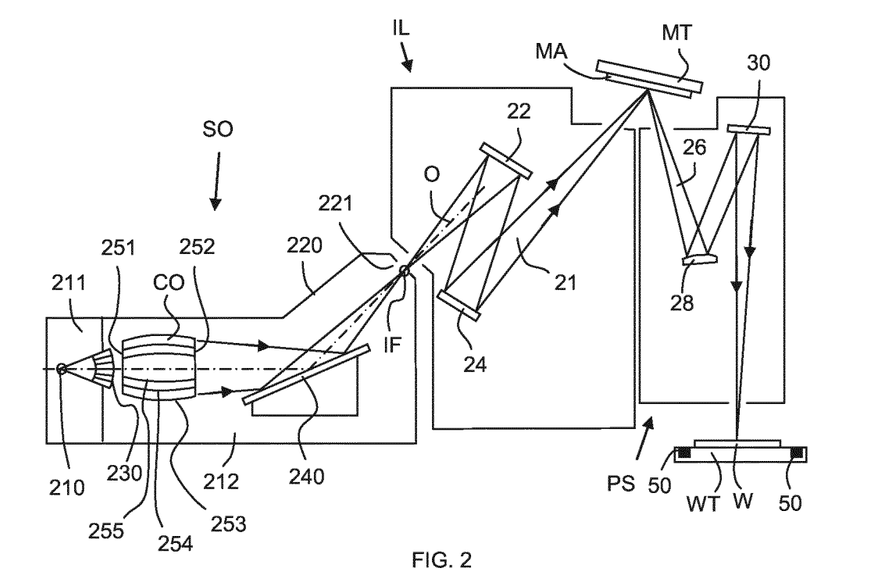
FIG. 2 is a more detailed view of the lithographic apparatus 100.

FIG. 2 shows the lithographic apparatus 100 in more detail, including the radiation source SO, the illumination system IL, and the projection system PS. The radiation source SO is constructed and arranged such that a vacuum environment can be maintained in an enclosing structure 220 of the radiation source SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the radiation source is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT. The lithographic apparatus may include a sensor 50 according to an embodiment of the invention. The sensor 50 may for example be located at the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
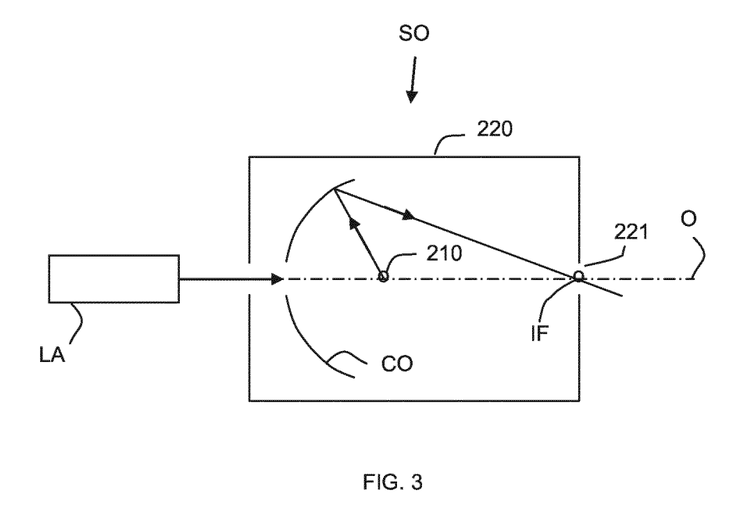
FIG. 3 is a more detailed view of the radiation source SO of the apparatus of FIGS. 1 and 2.

Alternatively, the radiation source SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
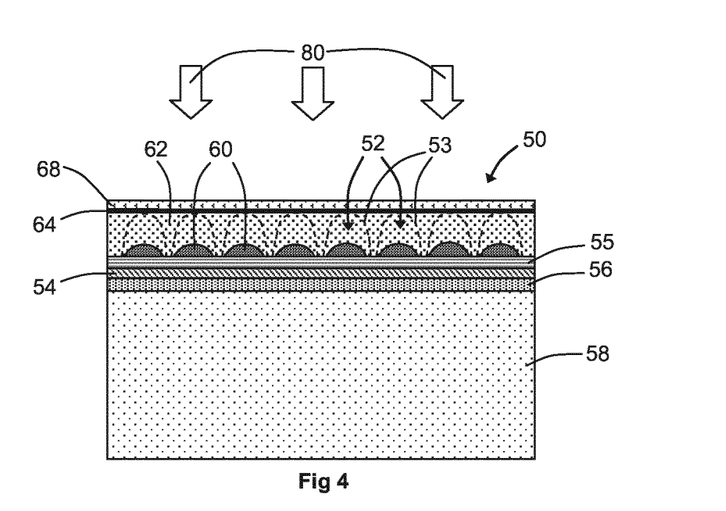
FIG. 4 is a schematic cross-sectional view of a sensor according to an embodiment of the invention.

FIG. 4 shows schematically viewed in cross-section a backside-illuminated radiation sensor 50 according to an embodiment of the invention. The sensor 50 may for example be provided in the substrate table WT of the lithographic apparatus (see FIGS. 1 and 2), or may be provided at some other suitable location in the lithographic apparatus. The backside-illuminated radiation sensor 50 is an imaging sensor in this embodiment. For brevity the backside-illuminated radiation sensor 50 may be referred to as the sensor 50.

The term "backside-illuminated" refers to the process by which the sensor is fabricated. Traditional (or frontside-illuminated) sensors make use of photodiodes (or other detectors) which are embedded in the surface of a semiconducting substrate, with circuitry provided either on top or beside the photodiodes. The circuitry is typically added after the photodiodes have been deposited. However, the presence of circuitry reduces the active area which is available for radiation collection by blocking and reflecting the incident radiation before it can be detected. Thus the sensitivity of the sensor is reduced.

Backside-illuminated radiation sensors, on the other hand, allow the fabrication of photodiodes (or other detectors) and then circuitry as required on one surface of a semiconducting substrate, before the substrate is flipped over. The substrate is then fixed to a second substrate. In this way, the back-side of the original substrate becomes the exposed top surface of the sensor, upon which radiation to be detected will be incident. This is advantageous because it results in no loss of active area which is available for radiation collection. In a backside-illuminated radiation sensor, circuitry is below the active area and so cannot block radiation from reaching the active area.

The sensor 50 shown in FIG. 4 comprises a semiconductor layer which comprises an array of photodiodes 52 which are connected to circuitry 55. A photodiode 52 comprising a region of n-doped semiconductor provided at a first surface of the semiconductor layer (being the frontside of the sensor 50), and a region of p-doped semiconductor forming a second surface of the semiconductor layer (being the backside of sensor 50). The photodiodes 52 comprise n-doped semiconductor portions (e.g., silicon) 60 arranged as a one- or two-dimensional array, together with p-doped semiconductor (e.g., silicon) 62 which is provided as an epitaxial layer on top of the n-doped semiconductor portions.

The p-doped silicon 62 forms a p-n junction with each n-doped silicon portion 60. This p-n junction establishes a depletion region 53 for each photodiode 52, being indicated in FIG. 4 by a dotted line 53. In the depletion region an electric field is established such that, when a photon enters the depletion region and excites an electron, the liberated electron and associated hole are attracted to opposite sides of the depletion region, thereby creating a photo-generated charge which is representative of the illumination energy. Thus, the depletion region 53 established by the p-n junction acts as the photodiode 52.

Zones of p+-doping may be provided between adjacent n-doped silicon portions 62. This may prevent neighboring depletion regions 53 from contacting each other. For simplicity, zones of p+-doping are not shown in the Figures.

In an embodiment, the n-doped silicon portion 60 may be n+-doped (highly doped n-silicon). Where this is the case, the depletion region will extend further into the p-doped silicon 62.

The circuitry 55 may for example be CMOS circuitry, and may for example be an integrated circuit. The CMOS circuitry 55 is used to bias the photodiodes. In addition, the CMOS circuitry is used to read photo-generated charge which is generated at the photodiodes as a result of exposure to DUV or EUV radiation.

A protective layer 54 is provided beneath the photodiodes 52 and the circuitry 55. The protective layer 54 may for example be $SiO_2$. A layer of glue 56 fixes the photodiodes 52 and circuitry to a supporting substrate 58. The supporting substrate 58 may for example be formed from a silicon wafer, a glass plate, or any other suitable material.

A layer of p-doping protective material such as an amorphous boron layer 64 is provided on top of the layer of p-doped silicon. The boron layer 64 is resistant to damage by DUV or EUV radiation. In addition, the boron layer 64 protects the sensor 50 from damage which might otherwise be caused by an aggressive environment. For example, the boron layer 64 protects the sensor 50 from cleaning agents which are periodically used to clean contamination from the sensor surface (deposits may accumulate on the sensor surface due to EUV radiation interacting with contamination at the sensor surface). The boron layer 64 thus prolongs the life of the backside-illuminated sensor 50.

The p-doping protective material deposition may be done at room temperature, followed by a thermal treatment enhancing the gradient diffusion. A potential disadvantage of such method (depending on deposition conditions and process used) could be a lesser quality of the boron layer, for example forming a porous structure leaving the backside surface more prone to degradation from aggressive environmental agents.

It was found advantageous to use a higher temperature deposition process for the p-doping protective material, especially for boron deposition. The deposition temperature should however be sufficiently low to protect the components of the CMOS, such as internal circuitry, wiring, poly-silicon gates. For typical CMOS or CCD components known in the art an upper temperature limit of 500° C. could provide still sufficient protection. Preferably the p-doping protective material deposition temperature is less than 450° C., more preferably less than 400° C. to provide sufficient safety against thermal damaging. Preferably the deposition temperature is more than 100° C., more preferably more than 200° C. in order to provide sufficient quality to the p-doping protective material layer.

Various known deposition methods may be used as such, for example magnetron coating or e-beam coating at the above referenced temperatures. Another alternative is to apply a low temperature CVD process, with the above referenced temperature ranges.

Optional optical coatings 68 such as anti-reflection layers are provided on top of the boron layer 64. However, the thickness of such coatings should be kept minimal such that the particles can tunnel through the coating and reach the boron layer 64.

The boron layer 64 may for example be a few nanometers thick. The boron layer 64 may for example have a thickness of between 1 nm and 30 nm. The boron layer 64 may for example have a thickness of around 6 nm. During deposition, part of the boron may naturally diffuse into the p-doped silicon 62. In this context the term "naturally" is intended to mean diffusion which may occur at room temperature (or a similar temperature), as opposed to diffusion which occurs due to heating. However, boron diffusion at room temperature will result in a very narrow diffusion at an insignificant scale. Deeper diffusion in the p-doped silicon region is achieved at temperatures above room temperature. The higher the temperature, the deeper the boron atoms will be pushed to diffuse in the semiconductor network.

A characteristic of boron and boride type materials is a gradient diffusion profile which results in a gradient diffusion layer providing a sharp change in p-doping material concentration from boron to silicon. The unique doping profile according to the invention having p-doping protective material diffused in a p-doped semiconductor region provides formation of a doping-gradient induced internal electric field, which complements the electrical field induced in the depletion region of the photodiodes (both fields having the same direction). The additional field has as an effect of extending the depletion layer towards the boron surface and ensures a photo-generated charged-particle transport mechanism via doping-gradient-induced surface charge collection. In same manner as for deposition, also when inducing diffusion the process temperature should be kept below the above mentioned temperatures to avoid damaging of the CMOS components. Furthermore, when deposition is performed at temperatures higher than room temperature, the gradient diffusion profile may be achieved directly during deposition.

The diffusion of the boron 64 into the p-doped silicon 62 is such that the concentration of boron decreases very rapidly as a function of depth in the silicon. For example, an upper layer of pure boron may be present, underneath which a boron silicon mixture may be present, the mixture decreasing in boron concentration until no diffused boron is present. This transition from boron to silicon may take place over a few nanometers or less.

The transition from boron to silicon is such that holes arising from the diffused boron have a density which reduces as the concentration of boron reduces. This change of hole concentration gives rise to the internal electric field which complements the electric field generated by the p-n junction of the photodiode 52. This is beneficial because it helps to draw the depletion region 53 of the photodiode 52 upwards toward the boron layer 64.

The p-doping protective material is however also a material which can be activated by the thermal processing to form bonds in the region of p-doped semiconductor network. Therefore, during the gradient diffusion process or thereafter a layer of an activated compound may be formed having substantially less dangling bonds than the semiconductor layer. An example of an activated compound formed in a silicon semiconductor layer is a silicide. When boron or boride is the p-doping protective material, a boron silicide layer will be formed ($B_xSi_{1-x}$ with x being a value between 0 and 1).

For example, a gradient diffusion profile achieved at the above referenced temperatures may be followed by a thermal surface treatment such as laser annealing, resulting in an activated compound layer. A surface thermal treatment will only raise the backside surface temperature and there is no deterioration of the CMOS components mentioned above.

A silicide layer, for example $B_xSi_{1-x}$, may be created after depositing the p-doping protective material (i.e. boron) on the backside surface of the silicon substrate at room temperature or somewhat higher temperature but still sufficiently low to not damage the CMOS circuitry, and then said surface is shortly heat-treated either by traditional furnace annealing or by rapid thermal annealing at a temperature providing enough energy to promote silicide formation besides forming the gradient diffusion profile.

The depletion region 53 may extend as far as at the boron to silicon transition, for example below the silicide layer. The depletion region 53 may for example extend as far as a (p++)-doped region of the transition. The highly doped (p++) region (and boron silicide of the transition) is a low Ohmic region which provides a common electrode for all photodiodes of the sensor 50. This common electrode may be at a fixed potential across the surface of the sensor 50 even when relatively high currents are running through it.

The boron layer 64 thus provides two functions. The first function is to protect the sensor 50 from damage caused by DUV or EUV radiation. The second function is to enhance the depletion regions 53 of the photodiodes 52.

The backside-illuminated sensor 50 may be used for example in a lithographic apparatus to detect EUV radiation. When this is the case, the penetration depth of EUV photons into the p-doped silicon 62 will be a few hundred nanometers. Thus, excitation of electrons to generate free electron and associated hole pairs may take place throughout the depth of the p-doped silicon 62. Where this is the case, it is not necessary for the photo-diode depletion regions 53 to extend fully to the surface of the sensor 50.

The backside-illuminated sensor 50 may be used for example in a lithographic apparatus to detect DUV radiation. DUV photons are absorbed within a few nanometers in silicon. Thus, in order to detect DUV radiation with a reasonable signal to noise ratio, the sensor may be arranged such that the depletion regions 53 of the photodiodes 52 extend to the upper surface of the sensor (or extend to within a few nanometers of the upper surface of the sensor). The boron layer 64, and in particular the transition of the boron to silicon may assist in pulling the depletion region towards the surface of the sensor, thereby facilitating good detection of DUV radiation.

Since the penetration depth of DUV radiation is significantly less than the penetration depth of EUV radiation, the thickness of the p-doped silicon layer 62 may be smaller for a sensor designed to detect (D)UV than for a sensor designed to detect EUV. For example, for a sensor designed to detect (D)UV or even visible radiation, the thickness of the p-doped silicon layer 62 may be less than 10 microns, such as around 5 microns. For a sensor designed to detect EUV, the thickness of the p-doped silicon layer 62 may be less than 80 microns, such as around 30 microns.

In the above paragraphs, references to the surface of the sensor 50 are not intended to include the optical coatings 68. Thus, for example, the reference to pulling the depletion region towards the surface of the sensor may be interpreted as meaning pulling the depletion region towards the surface of the boron layer 64.

Embodiments of the backside-illuminated sensor of the invention may for example be used as an image sensor to detect one or more patterns which are used to calibrate, adjust, and/or operate an apparatus, such as a lithographic apparatus. For example, the backside-illuminated sensor may form part of a phase-front detector which may be used to measure properties of the radiation beam as projected by the lithographic apparatus. The backside-illuminated sensor may form part of a camera (e.g., a camera chip of the camera may comprise the backside-illuminated sensor). The camera may include one or more lenses, and may include other components such as batteries. The backside-illuminated sensor may be used in non-lithographic applications. The camera which comprises the backside-illuminated sensor may for example be used to take pictures or to obtain videos.

FIG. 5 shows schematically a series of steps which may be used to construct the backside-illuminated sensor 50 shown in FIG. 4. Referring first to FIG. 5a, a p-doped silicon layer 62 is provided on top of a substrate 51, which in this case is a (p+)-doped silicon substrate (other substrates may be used). Any element of the III group elements of the periodic table may be used as acceptors (p-type dopants) for the region of p-doped semiconductor. The p-doped silicon layer 62 may for example have a thickness of between 1 micron and 30 microns, may have a thickness of between 1 micron and 20 microns, and may have a thickness of between 1 micron and 10 microns. An array of n-doped semiconductor portions 60 is formed in the p-doped silicon layer 62. When viewed from above, the n-doped semiconductor portions 60 may for example have the form of a two dimensional array (however it may also be unidimensional or even a single photodiode). The n-doped semiconductor portions 60 may for example be obtained by providing n-doping at desired locations on the surface of the p-doped silicon layer 62. The n-doping may for example be obtained using diffusion or ion implantation (using techniques which are well known in the art). The n-doped semiconductor portions 60 may for example extend between 0.1 micron and 1 micron into the p-doped silicon layer 62. The n-doped semiconductor portions 60 may for example extend around 0.5 microns into the p-doped silicon layer.

Figure 5A:
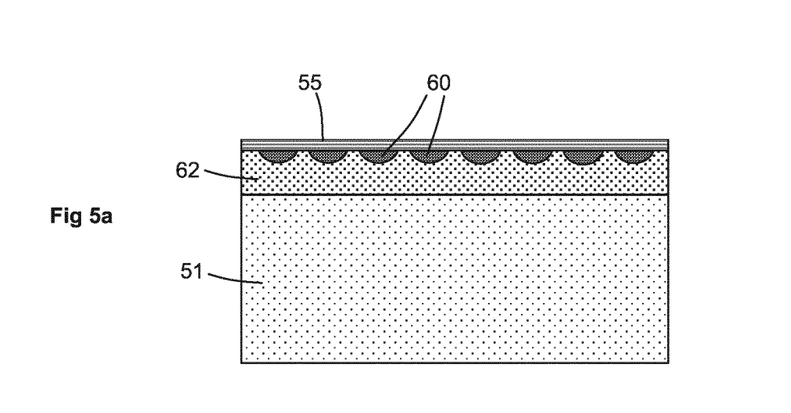
FIGS. 5a-5e are a schematic illustration of a series of steps which may be used to fabricate the sensor shown in FIG. 4.

In a next step an additional epitaxial layer is grown on the front side of the sensor 50 (i.e. on the first surface of the p-doped silicon layer 62) (e.g., p-doped silicon), within which the CMOS circuitry is formed (for example using conventional lithographic techniques). The CMOS circuitry may for example be configured to bias the photodiodes, and to allow read-out of electrical signals generated by radiation incident upon the photodiodes.

A protective layer 54 is provided on top of the n-doped semiconductor portions 60 of the CMOS circuitry (not shown). The protective layer 54 may for example be $SiO_2$.

Figure 5B:
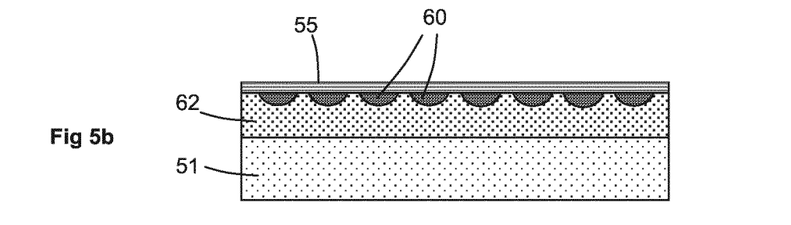

Referring to FIG. 5b, the substrate 51 is reduced in thickness, for example using polishing or any other suitable technique. The substrate 51 may for example be reduced to a thickness of around 200 microns or less.

Figure 5C:
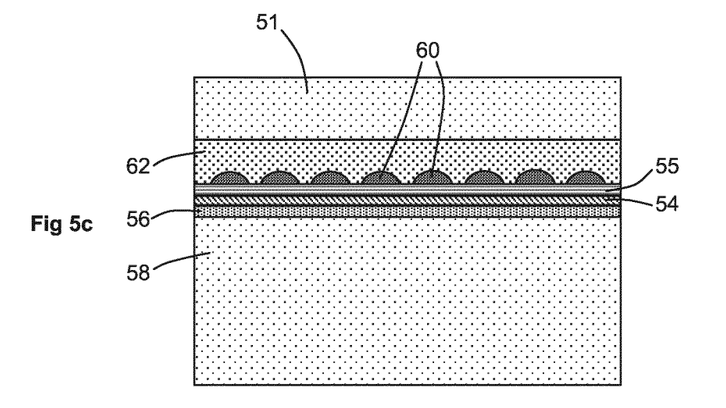

Referring to FIG. 5c, the semiconductor is inverted, and then fixed to a supporting substrate 58, for example using a layer of glue 56. The supporting substrate 58 may for example be a silicon wafer, a glass plate, or some other suitable material. The semiconductor may be fixed to the supporting substrate 58 using any suitable method (e.g., a method which does not damage the CMOS circuitry).

Figure 5D:
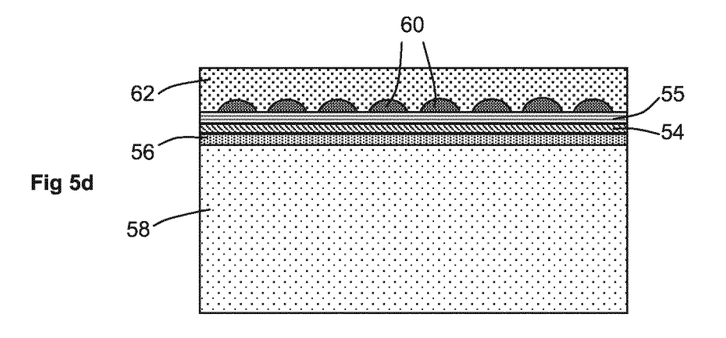

Referring to FIG. 5d, the silicon substrate is then removed, for example using a wet etch or some other suitable technique. This leaves behind the layer of p-doped silicon 62.

Figure 5E:
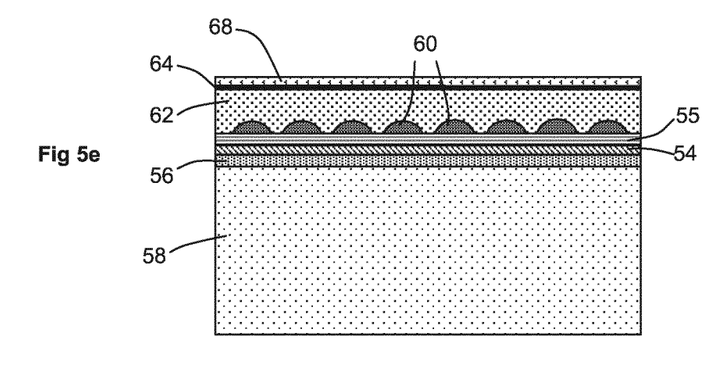

Referring to FIG. 5e, a layer of boron 64 is provided on top of the p-doped silicon layer 62. The layer of boron 64 may for example be formed using sputtering or any other suitable technique (e.g., a technique which can be implemented at temperatures which do not cause damage to the existing structure, for example temperatures lower than 400° C.). The boron layer 64 may for example have a thickness of 30 nanometers or less, 20 nanometers or less, or 10 nanometers or less. The boron layer 64 may for example have a thickness of 1 nanometer or more. The layer of boron 64 may for example have a thickness of around 6 nanometers. Since the boron layer 64 absorbs radiation, making the boron layer thinner will improve the sensitivity of the sensor. However, because the deposition of the boron may provide a non-uniform boron layer 64, making the boron layer thinner will increase the probability of there being pinholes in the boron layer. The boron layer 64 may be provided with a thickness which balances these two competing requirements.

Because the layer of boron 64 is provided at a low temperature (e.g., less than 400° C.), a narrow transition between the boron 64 and the p-doped silicon layer 62 will take place. The transition may for example take place over a fraction of a nanometer up to a few nanometers such as up to 5 nm or even up to 10 nm. The concentration of boron reduces across the transition. The transition may be described as boron, then boron silicide, then (p++)-doped silicon then (p+)-doped silicon, then p-doped silicon. At a lower end of the transition the concentration of boron drops off until there is no diffused boron present.

The gradient diffusion layer providing the transition from boron to silicon may be even thicker than 10 nm. In this case the sensor sensitivity will drop, but the conductivity of the first surface of the semiconductor layer (i.e. the common electrode for all pixels formed by the array) will increase, which may be favorable for some applications where faster response is preferred to higher sensitivity.

In an embodiment, it may be desired to increase the diffusion of the boron into the p-doped silicon. This may for example be achieved using laser annealing (or any other suitable method which does not heat the sensor to a temperature which could damage the CMOS circuitry). Alternatively, a short heat-treatment step may be applied to the backside surface of the sensor 50 at a temperature ≥500° C. in order to additionally facilitate formation of the silicide layer, with time control such that heating at high temperature is done only at the surface. The transition from boron to p-doped silicon in such case may for example take place over a few nanometers.

Optical coatings 68 such as antireflection coatings may be provided on top of the boron layer 64.

Referring to the sensor 50 in FIG. 4, in use the radiation (indicated by arrows 80) will be incident upon the sensor 50 at an opposite side from that which is conventional (i.e. from the backside of the sensor 50). The backside-illuminated surface is the second surface of the semiconductor layer. The sensor 50 may thus be considered to be a backside-illuminated sensor. The front-side of the sensor 50 may be considered to be the side of the sensor on which the CMOS circuitry 55 is provided, being the first surface of the semiconductor layer. Referring again to FIG. 5, steps 5a and 5b of the sensor fabrication process may be considered to be front-side processing, since they make changes to the front-side of the sensor. FIG. 5c shows inversion of the sensor. Steps 5d-5g of the sensor fabrication process may be considered to be backside processing, since they make changes to the back-side of the sensor.

The backside-illuminated sensor 50 provides significant advantages over prior art DUV and EUV image sensors, such as prior art sensors which use a conversion material to convert DUV or EUV photons into visible light before detection by a CMOS or CCD array or other prior art direct radiation detecting sensors described above. The conversion material may for example be phosphor, Yag-Ce or Lumilass. Conversion of DUV or EUV photons to visible photons in this manner is not efficient, the conversion process typically having efficiency of between 20 and 40 percent. Furthermore, the visible photons which are generated are emitted in all directions, not merely emitted in the direction of the detecting array. As a result of these drawbacks, measurement of radiation (particularly EUV radiation) may take a significant amount of time, which may reduce the productivity of a EUV lithographic apparatus. In addition, the image formed in the conversion material is blurred before it reaches a detector, thereby compromising the accuracy of the sensor. Furthermore, stray light is generated within the conversion material, thereby reducing the accuracy of the sensor.

Because embodiments of the invention directly detect (D)UV or EUV photons, the above disadvantages are avoided, and in addition an improved sensor protection against radiation induced degradation and/or environmental degradation is achieved.

The configuration of embodiments of the sensor is such that manufacture of embodiments of the sensor may be achieved in a manner which avoids any requirement to heat the entire semiconductor layer to high temperatures (e.g., 500° C. or more) after the CMOS circuitry has been formed. This is advantageous because heating the sensor to such temperatures would cause damage to the CMOS circuitry.

Although the photodiodes 52 of the illustrated embodiment are PN photodiodes, in an embodiment the photodiodes could be PIN photodiodes. That is, intrinsic semiconductor may be provided between the n-doped portions and the p-doped layer.

Although described embodiments of the invention have used silicon, other embodiments of the invention may use other semiconductors. For example embodiments of the invention may use high band-gap materials such as III-V materials (e.g., GaAs, AlGaN, etc.) instead of silicon. In that case, an equivalent gradient diffusion layer is expected to be formed between the p-doping protective material and the p-doped semiconductor region, the transition from p-doping protective material to the semiconductor layer comprising thus a layer of activated compound having substantially less dangling bonds than the semiconductor layer, being equivalent to the silicide layer referenced above.

A modified method (illustrated in FIGS. 5f and 5g) may be used to fabricate the sensor. In the modified method, the boron layer is deposited on a substrate before creating the p-doped layer of silicon. An advantage of this method is that at this stage of the method processing can be done at high temperatures such as ≥500° C., preferably ≥600° C. or even ≥700° C., because the temperature-sensitive parts (e.g., CMOS circuitry) have not yet been created. The p-doped layer of silicon created on top of the boron layer may start with a very high concentration of boron. The concentration of boron may be reduced while growing the p-doped silicon layer, for example such that the boron is at very low levels within a few nanometers. Reducing the concentration of the boron in this way will provide a changing concentration of holes, thereby giving to an electric field which complements the electric field generated by photodiode(s) of the sensor (in the same way as described further above).

Figure 5F:
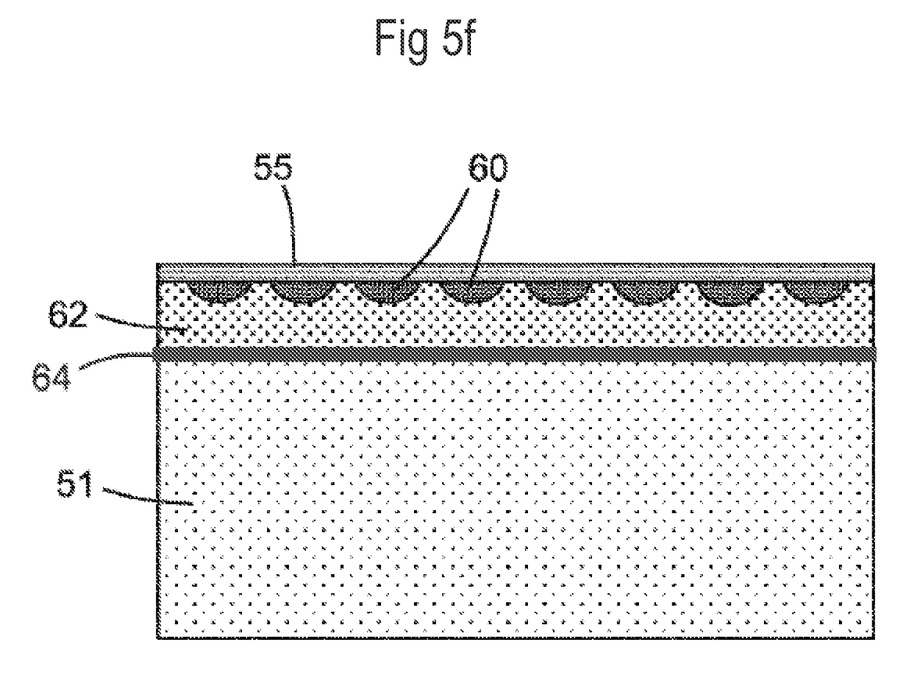
FIGS. 5f and 5g are schematic illustrations of a modified method used to fabricate the sensor, according to an embodiment of the invention.
Figure 5G:
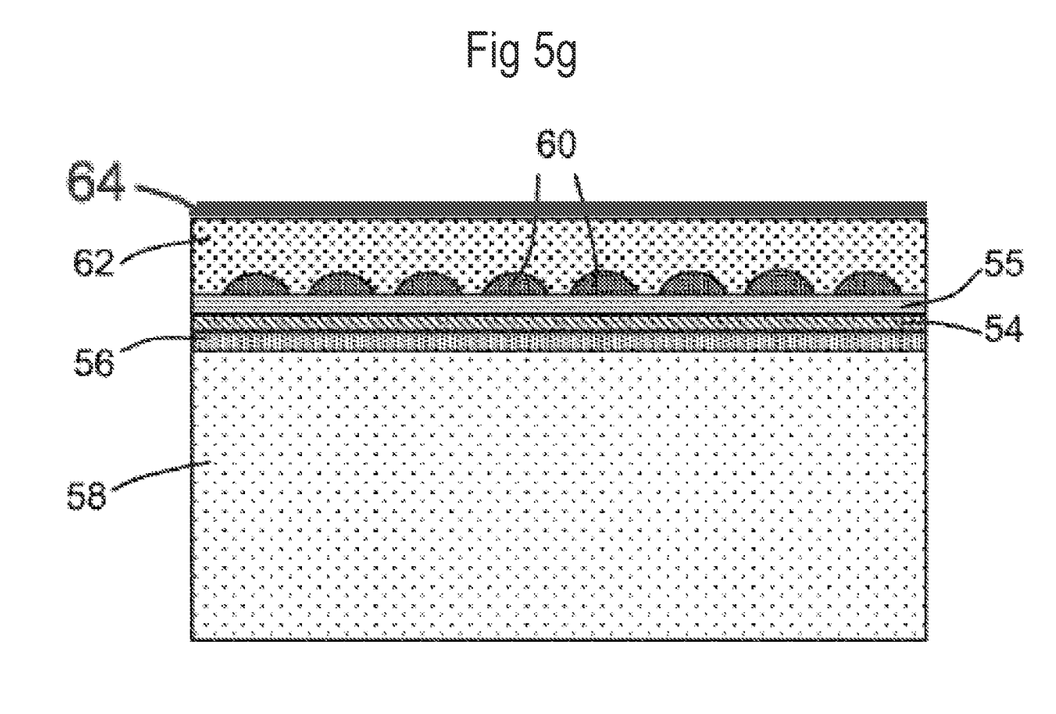

In the modified method the substrate upon which the boron layer has been deposited needs to be removed without also removing the boron itself. The boron may act as an "etch stop" for the etching means used. One way in which this could be achieved is to deposit an additional layer on the substrate surface before depositing the boron. This additional layer will thus be between the substrate and boron. The additional layer may have the property of being removable using an etch process for which boron is a reliable etch stop.

Although above described embodiments of the invention relate to a photodiode sensor with CMOS circuitry, the invention may be applied to other sensors. For example, the invention may be applied to a CCD sensor. The CCD sensor may for example include CMOS circuitry. For example, a CCD array may be provided at a first surface of a semiconductor layer and a layer of boron may be provided on a second surface of the semiconductor layer. The first surface of the semiconductor layer may be fixed to a surface of a supporting substrate.

Although embodiments of the invention have referred to boron, other materials may be used. Boron may be considered to be an example of a suitable p-doping protective material. Other suitable protective materials which could be used include borides, or other suitable materials known in the art. For example, gallium boride, boron fluoride, boron nitride or boron carbide could be used, as well as mixtures thereof or mixtures with boron. The term "boron" should be construed widely to include also materials comprising an excess of boron. The protective material may provide p-doping. The protective material may be resistant to damage caused by DUV and/or EUV radiation. The protective material may be resistant to damage caused by cleaning agents. The protective material may be substantially transparent to DUV and/or EUV radiation, or provided in a layer which is sufficiently thin that a significant proportion of incident DUV and/or EUV radiation passes through the protective layer.

Although embodiments of the invention refer to a p-type doping, the structure of the sensor according to the invention may be reversed with respect to the type of layers, i.e. the n-type layers may be of p-type and the p-type will be the n-type layers. Instead of p-type doping such as delivered by boron other n-doping protective materials may be used, such as phosphorus or arsenic. In such case the transition from n-doping protective material layer to n-doped semiconductor region may be described as a layer of n-doping protective material, then a silicide or an equivalent compound having substantially less dangling bonds than the semiconductor layer, then (n−−)-doped silicon, then (n−)-doped silicon, then n-doped silicon. At a lower end of the transition the concentration of n-dopant atoms drops off until there is no diffused n-dopant present. Elements from group V (such as phosphorous and arsenic) can be used as donors (n-type dopants) for the n-doped semiconductor region.

Although embodiments of the invention refer to the detection of (D)UV and EUV radiation, embodiments of the invention may be used in the whole UV range from 1 to 400 nm as well as the visible spectral range (VIS) from 400 to 1100 nm, and may also be used to detect low-energy particles. The low energy particles may for example be low energy electrons (e.g., electrons having an energy below 500 eV). Low-energy particles such as electrons are absorbed very quickly, in a similar manner to DUV photons. Providing a depletion region which extends close to the protective layer is advantageous because it will provide improved detection of low energy particles such as electrons (compared with the situation in which a depletion region stops a significant distance away from the protective layer).

The term "EUV radiation" may be interpreted as referring to electromagnetic radiation having a wavelength within the range of 5-20 nm, for example within the range of 13-14 nm, or in the range of 5-10 nm (e.g., 6.7 nm or 6.8 nm).

The term "DUV radiation" may be interpreted as referring to electromagnetic radiation having a wavelength within the range of 20-200 nm. The term "(D)UV radiation" may be interpreted as referring to electromagnetic radiation having a wavelength within the range of 20-400 nm The term "short wavelength ultraviolet radiation" may be considered to encapsulate both EUV and DUV radiation. The term "short wavelength ultraviolet radiation" may be considered to mean radiation in the wavelength range 5-200 nm.

Although the sensor may advantageously be provided in a substrate table WT of a lithographic apparatus, the sensor may be provided at any suitable location in a lithographic apparatus. Furthermore, the sensor may be used in other application areas (e.g., application areas in which detection of DUV or EUV radiation is desirable). These may include for example, wafer or mask inspection tools, or other apparatus associated with fabrication of integrated circuits. The term "lithographic process tool" may be considered to encompass lithographic apparatus, wafer or mask inspection tools, or other apparatus associated with fabrication of integrated circuits.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims and clauses set out below.

Clauses

1. A backside illuminated sensor comprising:
    a supporting substrate;
    a semiconductor layer comprising a photodiode having a region of n-doped semiconductor provided at a first surface of the semiconductor layer, and a region of p-doped semiconductor, wherein a depletion region is formed between the region of n-doped semiconductor and the region of p-doped semiconductor; and
    a layer of p-doping protective material provided on a second surface of the semiconductor layer;
    wherein the first surface of the semiconductor layer is fixed to a surface of the supporting substrate.
2. The backside-illuminated sensor of clause 1, wherein the depletion region extends to a location where a transition between the p-doping protective material and the semiconductor layer takes place.
3. The backside-illuminated sensor of clause 1, wherein the protective material is deposited on the semiconductor layer at a temperature lower than 500° C.
4. The backside-illuminated sensor of clause 1, wherein the protective material is boron or boride.
5. The backside-illuminated sensor of clause 1, wherein intrinsic semiconductor is provided between the region of n-doped semiconductor and the region of p-doped semiconductor.
6. The backside-illuminated sensor of clause 1, wherein circuitry is provided between the photodiode and the supporting substrate.
7. The backside-illuminated sensor of clause 5, wherein the circuitry is a CMOS circuitry.
8. The backside-illuminated sensor of clause 5, wherein a protective layer is provided between the integrated circuit and the supporting substrate.
9. The backside-illuminated sensor of clause 1, wherein the photodiode is one of an array of photodiodes which all share the same semiconductor layer.
10. The backside-illuminated sensor of clause 8, wherein the region of n-doped semiconductor is one of an array of regions of n-doped semiconductor.
11. The backside-illuminated sensor of clause 1, wherein the p-doped semiconductor is silicon.
12. The backside-illuminated sensor of clause 1, wherein the n-doped semiconductor is silicon.
13. The backside-illuminated sensor of clause 12, wherein the n-doped semiconductor is formed by diffusing dopant into the semiconductor layer via heating to a temperature in excess of 500° C.
14. The backside-illuminated sensor of clause 13, wherein the sensor is for use in the detection of EUV radiation, DUV radiation or a beam of low energy particles.
15. A backside illuminated sensor, comprising:
    a supporting substrate;
    a semiconductor layer, a CCD array being provided at a first surface of the semiconductor layer and a layer of p-doping protective material being provided on a second surface of the semiconductor layer;
    wherein the first surface of the semiconductor layer is fixed to a surface of the supporting substrate.
16. A processing tool comprising a backside illuminated sensor according to any one of the preceding clauses.
17. The processing tool of clause 16, wherein the tool is a lithographic apparatus.
18. The lithographic apparatus of clause 17, wherein the lithographic apparatus is a lithographic projection apparatus arranged to project a pattern from a patterning device onto a substrate.
19. The lithographic apparatus of clause 18, wherein the lithographic apparatus further comprises:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto a target portion of the substrate.
20. A substrate table provided with a backside illuminated sensor according to any one of clauses 1 to 15.
21. A camera chip comprising backside illuminated sensor according to any one of clauses 1 to 15.

22. A method of making a backside-illuminated sensor comprising:

providing a p-doped semiconductor layer on a first substrate;

forming an n-doped portion at a first surface of a p-doped semiconductor layer, such that a photodiode is formed with a depletion region between the region of n-doped semiconductor and the p-doped semiconductor layer;

providing circuitry on top of the photodiode;

inverting the semiconductor layer and fixing it to a second substrate;

removing the first substrate; and providing a layer of p-doping protective material on top of the semiconductor layer.

23. The method of clause 20, wherein the n-doped portion is one of an array of n-doped portions which form an array of photodiodes with the p-doped semiconductor layer.

The invention claimed is:

1. A method of making a backside-illuminated radiation sensor comprising:

disposing a layer of p-doping protective material on a first substrate comprising a semiconductor layer, wherein the layer of p-doping protective material is formed at a second surface of the semiconductor layer at a temperature greater than 500° C.;

disposing a p-doped semiconductor layer on the layer of p-doping protective material;

disposing a region of n-doped semiconductor at a first surface of the p-doped semiconductor layer such that a photodiode is formed with a depletion region between the region of n-doped semiconductor and the p-doped semiconductor layer;

disposing circuitry on top of the photodiode;

inverting the semiconductor layer such that the second surface of the semiconductor layer is the backside-illuminated surface of the radiation sensor, and wherein the layer of p-doping protective material is formed before the p-doped semiconductor layer.

2. The method of claim 1, wherein the region of n-doped semiconductor is one of an array of n-doped portions that form an array of photodiodes with the p-doped semiconductor layer.

3. The method of claim 1, wherein the p-doping protective material is selected from boron, boride or mixtures thereof.

4. The method of claim 3, wherein a thickness of the layer of p-doping protective material is less than 30 nm.

5. The method of claim 1, wherein the circuitry is a CMOS circuitry.

6. The method of claim 1, wherein the p-doped semiconductor is silicon.

7. A backside-illuminated radiation sensor comprising:

a layer of p-doping protective material comprising boron, boride or mixtures thereof disposed on a first substrate comprising a semiconductor layer, wherein the layer of p-doping protective material is formed at a second surface of the semiconductor layer at a temperature greater than 500° C.;

a p-doped semiconductor layer disposed on the layer of p-doping protective material;

a region of n-doped semiconductor disposed at a first surface of the p-doped semiconductor layer such that a photodiode is formed with a depletion region between the region of n-doped semiconductor and the p-doped semiconductor layer;

circuitry disposed on top of the photodiode; and wherein the semiconductor layer at the second surface of the semiconductor layer forms a backside-illuminated surface of the radiation sensor, and wherein the layer of p-doping protective material is formed before the p-doped semiconductor layer.

* * * * *